United States Patent
Oota et al.

(10) Patent No.: US 6,841,628 B2
(45) Date of Patent: Jan. 11, 2005

(54) RESIN COMPOSITION, ADHESIVES PREPARED THEREWITH FOR BONDING CIRCUIT MEMBERS, AND CIRCUIT BOARDS

(75) Inventors: Satoru Oota, Tsukuba (JP); Masami Yusa, Tsukuba (JP); Akira Nagai, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 330 days.

(21) Appl. No.: 10/203,408

(22) PCT Filed: Feb. 9, 2001

(86) PCT No.: PCT/JP01/00906

§ 371 (c)(1),
(2), (4) Date: Aug. 9, 2002

(87) PCT Pub. No.: WO01/59007

PCT Pub. Date: Aug. 16, 2001

(65) Prior Publication Data

US 2003/0027942 A1 Feb. 6, 2003

(30) Foreign Application Priority Data

| Feb. 9, 2000 | (JP) | 2000-038084 |
| Feb. 9, 2000 | (JP) | 2000-038085 |
| Feb. 9, 2000 | (JP) | 2000-038086 |
| Feb. 9, 2000 | (JP) | 2000-038087 |
| Feb. 9, 2000 | (JP) | 2000-038088 |

(51) Int. Cl.[7] ............................................. C08L 71/02
(52) U.S. Cl. ..................................... 525/403; 525/407
(58) Field of Search ................................. 525/403, 407

(56) References Cited

U.S. PATENT DOCUMENTS 4,647,648 A * 3/1987 Silvis et al. .................. 528/102

FOREIGN PATENT DOCUMENTS

| JP | 10-120753 | 5/1998 |
| JP | 10-120761 | 5/1998 |
| WO | WO 98/15597 | 4/1998 |

* cited by examiner

Primary Examiner—William K. Cheung
(74) Attorney, Agent, or Firm—Antonelli, Terry, Stout & Kraus, LLP

(57) ABSTRACT

The present invention relates to a resin composition which gives a resin product with a low hygroscopic property, an adhesive for connecting a circuit member and a circuit board, and provides a resin composition, an adhesive for connecting a circuit member and a circuit board comprising (A) a polyhydroxy polyether resin represented by the formula (I):

wherein $R^1$ to $R^8$ each represent H, $C_{1-4}$ alkyl group, $C_{2-5}$ alkenyl group, $C_{1-4}$ hydroxyalkyl group or halogen atom; $R_a$ represents H or $C_{1-2}$ alkyl group; $R_b$ represents $C_{2-13}$ alkyl group; and n is a recurring number, or the following formula (II):

wherein $R^9$ to $R^{12}$ each represent H, $C_{1-6}$ alkyl group, $C_{1-6}$ hydroxyalkyl group or halogen atom; $R_c$ to $R_f$ each represent H, $C_{1-6}$ alkyl group, cyclohexyl group, aryl group, aralkyl group or halogen atom; and m is a recurring number, and (B) a three dimensionally cross-linkable resin.

25 Claims, No Drawings

RESIN COMPOSITION, ADHESIVES PREPARED THEREWITH FOR BONDING CIRCUIT MEMBERS, AND CIRCUIT BOARDS

FIELD OF THE INVENTION

The present invention relates to a resin composition, and an adhesive for connecting a circuit member and a circuit board using the same, more specifically, to a resin composition providing a low hygroscopic resin molded product, in particular, a resin composition suitable for a circuit connecting member for electronic parts, an adhesive for connecting a circuit member to be used for connecting circuit boards or an IC chip or electronic parts and a circuit board, and a circuit board in which a semiconductor chip is adhered and fixed to a substrate by an adhesive according to, for example, the flip chip application system, and both electrodes are electrically connected.

PRIOR ART

At present, an organic material such as an epoxy resin, etc. has been widely used in the field of a semiconductor. In the field of an encapsulating material, 90% of an encapsulating system is replaced with a resin encapsulation system. The encapsulating material is a composite material constituted by an epoxy resin, a curing agent, various kinds of additives, an inorganic filler, etc., and as the epoxy resin, a cresol-novolak type epoxy resin has widely been used. However, the cresol-novolak type epoxy resin does not have required characteristics such as low water-absorption property, low elasticity, etc., so that it is difficult to apply to a surface application system. Thus, a number of novel and high performance epoxy resins have been proposed and practically used in place of the above.

Also, as a conductive adhesive agent for die bonding, a silver paste in which silver powder is kneaded in an epoxy resin has widely been used. However, accompanying with change in a mounting system of semiconductor elements on a wiring board to the surface application system, it has been earnestly desired to improve solder resistance reflow property of the silver paste. To solve this problem, improvements in voids, peel strength, water absorption rate, elasticity, etc., of an adhesive layer for die bonding after curing have been made.

In the field of a semiconductor application, as a novel application system corresponding to low cost and high resolution, a flip chip application in which an IC chip is directly mounted on a printing board or a flexible wiring board has been attracting attention. As the flip chip application system, there has been known a system in which solder bump is provided at a terminal of the chip, and solder connection is carried out, or a system in which electronic connection is carried out through a conductive adhesive. In these systems, there is a problem that a stress based on the difference in thermal expansion coefficients of the chip and the substrate to be connected occurs at the connection interface when it is exposed to various kinds of environments and connection reliability is lowered. Thus, to relax the stress at the connection interface, it has been studied to use a system in which an epoxy resin type under fill material is injected into a gap between the chip/substrate. This under fill injecting step, however, makes the process complicated and there are problems of causing disadvantages in productivity and costs. To solve such problems, in recent years, a flip chip application using an anisotropic conductive adhesive having anisotropic conductivity and encapsulating function has been attracted attention in the viewpoint of simple and easy processability.

When the chip is mounted on a substrate through an anisotropic conductive material, under hygroscopic conditions, an adhesive force between the adhesive and the chip or between the adhesive and the interface of the substrate is lowered. Moreover, under temperature cycle conditions, a stress based on the difference in thermal expansion coefficients of the chip and the substrate occurs at the connection portion whereby there are problems of increase in connection resistance or peeling of the adhesive when reliability tests such as a thermal impact resistance test, a PCT (pressure cooker test) test, a high temperature and high humidity test, etc. are carried out. Also, in a semiconductor package, a solder resistant reflow temperature test is carried out after absorbing water by a high temperature and high humidity test, there are problems that a connection resistance is increased or peeling of the adhesive occurs due to abrupt expansion of water component absorbed in the adhesive. In general, for the purpose of relaxing internal stress of an epoxy resin and for strengthening the resin, a technique in which a liquid rubber or cross-linked rubber, and core-shell type rubber particles are dispersed has been known. However, in a cured product in which a rubber is dispersed in an epoxy resin, it has been known that a softening point temperature (or a glass transition temperature, hereinafter referred to as Tg) is lowered as compared to that of the cured product comprising the epoxy resin alone so that it becomes a cause of lowering in reliability in the field of requiring high heat resistance. On the other hand, when a cross linking density of the epoxy resin is increased to improve Tg in a rubber dispersion system, it causes lowering in an effect of rubber dispersion and increasing in brittleness of the cured product as well as increasing water absorption ratio whereby it becomes a cause of lowering reliability. Also, as a method of strengthening an epoxy resin without lowering Tg, a formulation with a high heat resistant thermoplastic resin which has been known as an engineering plastic has been known. However, these engineering plastics are generally poor in solubility in a solvent so that a formulation with an epoxy resin is prepared by kneading of powder whereby a development of the material to the use of an adhesive is not suitable.

An object of the present invention is to provide a resin composition providing a low hygroscopic resin molded product, in particular, a resin composition which is suitable when it is used as an adhesive or a circuit connecting member for electronic parts, as well as to provide an adhesive for connecting a circuit member and a circuit board wherein there is no increase in connecting resistance at the connected portion or no peeling of the adhesive, and connecting reliance is markedly improved.

DISCLOSURE OF THE INVENTION

The present invention relates to a resin composition which comprises (A) a polyhydroxy polyether resin represented by the following formula (I):

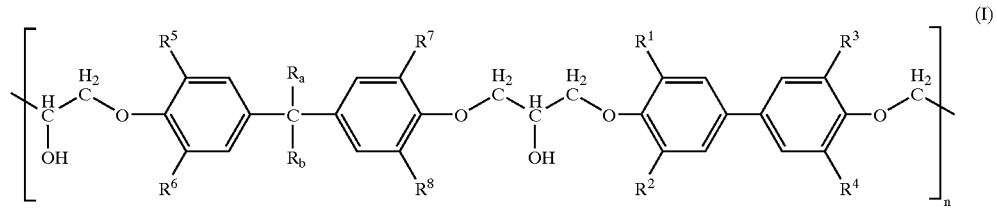

(I)

wherein $R^1$, $R^2$, $R^3$, $R^4$, $R^5$, $R^6$, $R^7$ and $R^8$ may be the same or different from each other and each represent a hydrogen atom, a straight or branched alkyl group having 1 to 4 carbon atoms, an alkenyl group having 2 to 5 carbon atoms, a hydroxyalkyl group having 1 to 4 carbon atoms or a halogen atom; $R_a$ represents a hydrogen atom or an alkyl group having 1 to 2 carbon atoms; $R_b$ represents a straight or branched alkyl group having 2 to 13 carbon atoms; and n is a number of a recurring unit and satisfying that a weight average molecular weight of the polyhydroxy polyether resin in terms of standard polystyrene is 5,000 to 1,000,000, and (B) a three dimensionally cross-linkable resin.

The present invention also relates to an adhesive for connecting a circuit member, which interposes between circuit electrodes opposed to each other, and, when these circuit electrodes opposed to each other are pressed, electrically connects these electrodes in a pressed direction, and comprises (A) a polyhydroxy polyether resin represented by the above-mentioned formula (I) and/or the following formula (II):

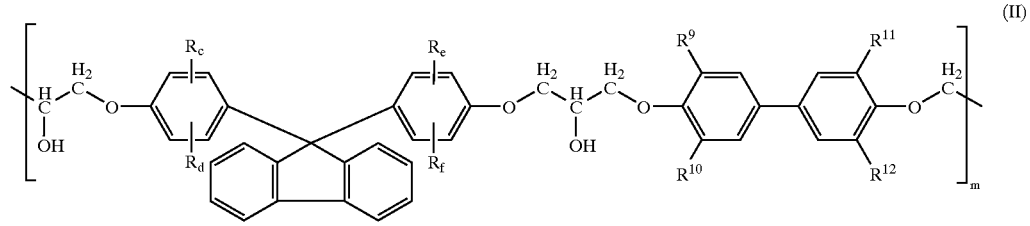

(II)

wherein $R^9$, $R^{10}$, $R^{11}$ and $R^{12}$ may be the same or different from each other and each represent a hydrogen atom, a straight or branched alkyl group having 1 to 6 carbon atoms, a hydroxyalkyl group having 1 to 6 carbon atoms or a halogen atom; $R_c$, $R_d$, $R_e$ and $R_f$ may be the same or different from each other and each represent a hydrogen atom, a straight or branched alkyl group having 1 to 6 carbon atoms, a cycloalkyl group having 6 carbon atoms, an aryl group, an aralkyl group or a halogen atom; and m is a number of a recurring unit and satisfying that a weight average molecular weight of the polyhydroxy polyether resin in terms of standard polystyrene is 5,000 to 1,000,000, and (B) a three dimensionally cross-linkable resin.

Moreover, the present invention relates to a circuit board which comprises a first circuit member having a first connecting terminal and a second circuit memberhaving a second connecting terminal which are so provided to oppose to each other, and an adhesive interposed between the first connecting terminal and the second connecting terminal opposed to each other, and the first connecting terminal and the second connecting terminal opposed to each other being electrically connected by heating and pressurizing, wherein said adhesive contains (A) the polyhydroxy polyether resin represented by the above-mentioned formula (I) and/or (II), and (B) a three dimensionally cross-linkable resin.

BEST MODE FOR CARRYING OUT THE INVENTION

The resin composition of the present invention is preferably used as a member for connecting a circuit member. It is preferably used as a connecting member for a flip chip application or for an adhesive for adhering a circuit member which connects the first circuit member having the first connecting terminal and the second circuit member having the second connecting terminal.

As the circuit member to be used in the present invention, there may be mentioned chip parts such as a semiconductor chip, a resister chip, a condenser chip, etc.; and a substrate such as a printing board, a flexible wiring board which uses polyimide or polyester as a base material, an ITO glass substrate, etc. On a semiconductor chip or an electrode pad of a substrate, a gold ball is formed by melting a bump formed by plating or a tip of a gold wire with a torch, etc., and after press-contacting the ball on the electrode pad, a projected electrode such as a wire bump obtained by cutting a wire is provided whereby it is used as a connection terminal.

In the adhesive for connecting a circuit member of the present invention, a polyhydroxy polyether resin represented by the above-mentioned formula (I) and/or (II) is used. It is preferred that water absorption rate of the resin represented by the formula (I) is 0.1 to 1.2% by weight and a glass transition temperature thereof is 40 to 100° C. Also, the polyhydroxy polyether resin represented by the formula (II) preferably has a glass transition temperature of 60 to 120° C. Moreover, the polyhydroxy polyether resin represented by the formula (I) and/or (II) is preferably soluble in a mixed solvent of an aromatic hydrocarbon solvent and an oxygen atom-containing organic solvent.

The polyhydroxy polyether resin represented by the formula (I) can be synthesized by a biphenol compound and a bisphenol compound or their diglycidyl compounds.

In the formula (I), $R^1$, $R^2$, $R^3$, $R^4$, $R^5$, $R^6$, $R^7$ and $R^8$ are as mentioned above, may be the same or different from each other and each represent a hydrogen atom, a straight or branched alkyl group having 1 to 4 carbon atoms, an alkenyl group having 2 to 5 carbon atoms, a hydroxyalkyl group having 1 to 4 carbon atoms or a halogen atom. As the straight or branched alkyl group having 1 to 4 carbon atoms, there may be mentioned a methyl group, an ethyl group, an n-propyl group, an isopropyl group, an n-butyl group, an isobutyl group and a sec-butyl group, preferably a methyl group, an ethyl group, an n-propyl group and an n-butyl group. As the alkenyl group having 2 to 5 carbon atoms, there may be mentioned an ethynyl group, a propenyl group, a butenyl group, etc., and preferably a propenyl group. As the hydroxyalkyl group having 1 to 4 carbon atoms, there may be mentioned a hydroxymethyl group, a hydroxyethyl group, a hydroxypropyl group and a hydroxy-butyl group, and preferably a hydroxymethyl group. As the halogen atom, there may be mentioned a fluorine atom, a chlorine atom, a bromine atom, an iodine atom, etc., and preferably a fluorine atom. Of these, a hydrogen atom, a methyl group, a hydroxymethyl group and a fluorine atom are particularly preferred. $R_a$ represents a hydrogen atom or an alkyl group having 1 to 2 carbon atoms, preferably a hydrogen atom or a methyl group, and particularly preferably a methyl group. $R_b$ represents a straight or branched alkyl group having 2 to 13 carbon atoms, and there may be mentioned, for example, an ethyl group, an n-propyl group, an isopropyl group, an n-butyl group, an isobutyl group and a sec-butyl group, preferably a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group and an n-tridecyl group, etc., preferably a straight alkyl group having 6 to 9 carbon atoms. n is a number of a recurring unit and satisfying that a weight average molecular weight of the polyhydroxy polyether resin in terms of standard polystyrene is 5,000 to 1,000,000.

As the biphenol compound for synthesizing the polyhydroxy polyether resin, there may be mentioned, for example, 1,1'-biphenyl-4,4'-diol (wherein $R^1$, $R^2$, $R^3$ and $R^4$ are all hydrogen atoms), 3,3'-dimethyl-(1,1'-biphenyl)-4,4'-diol ($R^1$ and $R^3$ are alkyl groups having 1 carbon atom, and $R^2$ and $R^4$ are hydrogen atoms), 3,3',5,5'-tetramethyl-(1,1'-biphenyl)-4,4'-diol (wherein $R^1$, $R^2$, $R^3$ and $R^4$ are all alkyl groups having 1 carbon atom), 3,3'-bis(2-propenyl)-(1,1'-biphenyl)-4,4'-diol ($R^1$ and $R^3$ are alkenyl groups having 3 carbon atom, and $R^2$ and $R^4$ are hydrogen atoms), 2,2'-dibutyl-5,5'-dimethyl-(1,1'-biphenyl)-4,4'-diol ($R^1$ and $R^3$ are alkyl groups having 1 carbon atom, and $R^2$ and $R^4$ are alkyl groups having 4 carbon atoms), 3,3',5,5'-tetrakis(hydroxymethyl)-(1,1'-biphenyl)-4,4-diol (wherein $R^1$, $R^2$, $R^3$ and $R^4$ are all hydroxymethyl groups), 3,3'-difluoro-(1,1'-biphenyl)-4,4'-diol ($R^1$ and $R^3$ are fluorine atoms, and $R^2$ and $R^4$ are hydrogen atoms), and 3,3',5,5'-tetrafluoro-(1,1'-biphenyl)-4,4'-diol (wherein $R^1$, $R^2$, $R^3$ and $R^4$ are all fluorine atoms).

As the bisphenol compound, there may be mentioned, for example, 1,1-(4,4'-dihydroxydiphenyl)-3-methylbutane ($R_a$ is a hydrogen atom, and $R_b$ is a branched alkyl group having 4 carbon atoms), 2,2-(4,4'-dihyroxydiphenyl)-4-methylpentane ($R_a$ is an alkyl group having 1 carbon atom, and $R_b$ is a branched alkyl group having 4 carbon atoms), 1,1-(4,4'-dihydroxydiphenyl)-3-ethylhexane ($R_a$ is a hydrogen atom, and $R_b$ is a branched alkyl group having 7 carbon atoms), 3,3-(4,4'-dihyroxydiphenyl)pentane ($R_a$ is an alkyl group having 2 carbon atoms, and $R_b$ is an alkyl group having 2 carbon atoms), 2,2-(4,4'-dihyroxydiphenyl)-heptane ($R_a$ is an alkyl group having 1 carbon atom, and $R_b$ is a straight alkyl group having 5 carbon atoms), 1,1-(4,4'-dihydroxydiphenyl)heptane ($R_a$ is a hydrogen atom, and $R_b$ is a straight alkyl group having 6 carbon atoms), 2,2-(4,4'-dihydroxydiphenyl)octane ($R_a$ is an alkyl group having 1 carbon atom, and $R_b$ is a straight alkyl group having 6 carbon atoms), 1,1-(4,4'-dihydroxydiphenyl)octane ($R_a$ is a hydrogen atom, and $R_b$ is a straight alkyl group having 7 carbon atoms), 2,2-(4,4'-dihydroxydiphenyl)nonane ($R_a$ is an alkyl group having 1 carbon atom, and $R_b$ is a straight alkyl group having 7 carbon atoms), 1,1-(4,4'-dihydroxydiphenyl)nonane ($R_a$ is a hydrogen atom, and $R_b$ is a straight alkyl group having 8 carbon atoms), 2,2-(4,4'-dihydroxydiphenyl)decane ($R_a$ is an alkyl group having 1 carbon atom, and $R_b$ is a straight alkyl group having 8 carbon atoms), 1,1-(4,4'-dihydroxydiphenyl)decane ($R_a$ is a hydrogen atom, and $R_b$ is a straight alkyl group having 9 carbon atoms), 2,2-(4,4'-dihydroxydiphenyl)undecane ($R_a$ is an alkyl group having 1 carbon atom, and $R_b$ is a straight alkyl group having 9 carbon atoms), 1,1-(4,4'-dihydroxydiphenyl)undecane ($R_a$ is a hydrogen atom, and $R_b$ is a straight alkyl group having 10 carbon atoms), 2,2-(4,4'-dihydroxydiphenyl)dodecane ($R_a$ is an alkyl group having 1 carbon atom, and $R_b$ is a straight alkyl group having 10 carbon atoms), 1,1-(4,4'-dihydroxydiphenyl)dodecane ($R_a$ is a hydrogen atom, and $R_b$ is a straight alkyl group having 11 carbon atoms), 2,2-(4,4'-dihydroxydiphenyl)tridecane ($R_a$ is an alkyl group having 1 carbon atom, and $R_b$ is a straight alkyl group having 11 carbon atoms), 1,1-(4,4'-dihydroxydiphenyl)tridecane ($R_a$ is a hydrogen atom, and $R_b$ is a straight alkyl group having 12 carbon atoms), 2,2-(4,4'-dihydroxydiphenyl)tetradecane ($R_a$ is an alkyl group having 1 carbon atom, and $R_b$ is a straight alkyl group having 12 carbon atoms), 1,1-(4,4'-dihydroxydiphenyl)-tetradecane ($R_a$ is a hydrogen atom, and $R_b$ is a straight alkyl group having 13 carbon atoms) and 2,2-(4,4'-dihydroxydiphenyl)pentadecane ($R_a$ is an alkyl group having 1 carbon atom, and $R_b$ is a straight alkyl group having 13 carbon atoms), and these may be used in combination of two or more by mixing. Of these, 2,2-(4,4'-dihyroxydiphenyl)-octane ($R_a$ is an alkyl group having 1 carbon atom, and $R_b$ is a straight alkyl group having 6 carbon atoms) and 1,1-(4,4'-dihydroxydiphenyl)decane ($R_a$ is a hydrogen atom, and $R_b$ is a straight alkyl group having 9 carbon atoms) are preferably used.

The polyhydroxy polyether resin represented by the formula (II) can be synthesized by a biphenol compound and a fluorenylidenediphenol compound or their diglycidyl compounds.

In the above-mentioned formula (II), $R^9$, $R^{10}$, $R^{11}$ and $R^{12}$ are as mentioned above, may be the same or different from each other and each represent a hydrogen atom, a straight or branched alkyl group having 1 to 6 carbon atoms, a hydroxyalkyl group having 1 to 6 carbon atoms or a halogen atom. As the straight or branched alkyl group having 1 to 6 carbon atoms, there may be mentioned, for example, a methyl group, an ethyl group, an n-propyl group, an isopropyl group, an n-butyl group, an isobutyl group, a sec-butyl group, an n-pentyl group and an n-hexyl group, etc., preferably a methyl group, an ethyl group, an n-propyl group and an n-butyl group. As the hydroxyalkyl group having 1 to 6 carbon atoms, there may be mentioned, for example, a hydroxymethyl group, a hydroxyethyl group, a hydroxypropyl group, a hydroxybutyl group, a hydroxy-pentyl group and a hydroxyhexyl group, and preferably a hydroxymethyl group. As the halogen atom, there may be mentioned a fluorine atom, a chlorine atom, a bromine atom, an iodine atom, etc., and preferably a fluorine atom. Of these, a hydrogen atom, a methyl group, a hydroxymethyl group and a fluorine atom are particularly preferred. $R_c$, $R_d$, $R_e$ and $R_f$ are as mentioned above, may be the same or different from each other and each represent a hydrogen atom, a straight or branched alkyl group having 1 to 6 carbon atoms, a cycloalkyl group having 6 carbon atoms, an aryl group, an aralkyl group or a halogen atom. As the straight or branched alkyl group having 1 to 6 carbon atoms and the halogen atom, those as mentioned in the above R to R are mentioned. As the aryl group, there may be mentioned, for example, a phenyl group, a naphthyl group, an anthranyl group, etc., and these groups may have a substituent(s). As the aralkyl group, there may be mentioned, for example, a benzyl group, a phenethyl group, etc., and these groups may have a substituent(s). m is a number of a recurring unit and satisfying that a weight average molecular weight of the polyhydroxy polyether resin in terms of standard polystyrene is 5,000 to 1,000,000.

The biphenol compound to be used for synthesizing the polyhydroxy polyether resin represented by the above-mentioned formula (II) is the same as mentioned in the formula (I) above except for the substituents of $R^9$ to $R^{12}$ as defined above.

As the fluorenylidenediphenol compound to be used for synthesizing the polyhydroxy polyether resin represented by the above-mentioned formula (II), there may be mentioned, for example, 4,4'-(9-fluorenylidene)-diphenol ($R_c$, $R_d$, $R_e$ and $R_f$ are all hydrogen atoms), 4,4'-(9H-fluoren-9-ylidene)bis[2-methylphenol] ($R_c$ and $R_e$ are alkyl groups having 1 carbon atom, and $R_d$ and $R_f$ are hydrogen atoms), 4,4'-(9H-fluoren-9-ylidene)bis[2,5-dimethylphenol] ($R_c$, $R_d$, $R_e$ and $R_f$ are all alkyl groups having 1 carbon atom), 4,4'-(9H-fluoren-9-ylidene)bis[2,6-dimethylphenol] ($R_c$, $R_d$, $R_e$ and $R_f$ are all alkyl groups having 1 carbon atom), 4,4'-(9H-fluoren-9-ylidene)bis[2-propenylphenol] ($R_c$ and $R_e$ are alkyl groups having 3 carbon atoms, and $R_d$ and $R_f$ are hydrogen atoms), 4,4'-(9H-fluoren-9-ylidene)bis[2-(1-methylethylphenol)] ($R_c$ and $R_e$ are alkyl groups having 3 carbon atoms, and $R_d$ and $R_f$ are hydrogen atoms), 4,4'-(9H-fluoren-9-ylidene)bis[2-(2-methylpropyl)phenol] ($R_c$ and $R_e$ are alkyl groups having 4 carbon atoms, and $R_d$ and $R_f$ are hydrogen atoms), 4,4'-(9H-fluoren-9-ylidene)bis[2-(1,1-dimethylethyl)phenol] ($R_c$ and $R_e$ are alkyl groups having 4 carbon atoms, and $R_d$ and $R_f$ are hydrogen atoms), 5,5'-(9H-fluoren-9-ylidene)bis(1,1'-biphenyl)-2-ol ($R_c$ and $R_e$ are hydrogen atoms, and $R_d$ and $R_f$ are benzyl groups), 4,4'-(9H-fluoren-9-ylidene)bis[2-cyclohexyl-5-methylphenol] ($R_c$ and $R_e$ are alkyl groups having 1 carbon atom, and $R_d$ and $R_f$ are cycloalkyl groups having 6 carbon atoms) and 4,4'-(9H-fluoren-9-ylidene)bis[2-fluorophenol] ($R_c$ and $R_e$ are fluorine atoms, and $R_d$ and $R_f$ are hydrogen atoms).

As the diglycidyl ether compounds, there may be mentioned compounds in which the above-mentioned biphenol compound, bisphenol compound or fluorenylidene compound is subjected to diglycidyl etherification.

The above-mentioned polyhydroxy polyether resin can be synthesized by a solution polymerization method. In the case of fusion and mixing, it is not preferred since a high molecular weight resin cannot be prepared. In case of the solution polymerization, it is carried out by, for example, (1) the biphenol compound and a diglycidyl ether compound of the bisphenol compound or the fluorenylidene diphenol compound, or (2) a diglycidyl ether compound of the biphenol compound and the bisphenol compound or the fluorenylidene diphenol compound are dissolved in a solvent, which dissolves the polyhydroxy polyether resin which is an objective material, such as N-methylpyrrolidone, etc., then, a base such as sodium hydroxide, potassium carbonate, etc. is added to the solution and the mixture is reacted at 100 to 130° C. for 1 to 5 hours to synthesize a resin having a structure represented by the formula (I) or (II) which is a reaction product. As the polyhydroxy polyether resin to be used as an adhesive of the present invention, preferred are those having a weight average molecular weight (Mw) measured by gel permeation chromatography using tetrahydrofuran as a solvent of 5,000 or more to 1,000,000 or less in terms of standard polystyrene. More preferred are those having Mw of 10,000 or more to 450,000 or less. If it is less than 5,000, the adhesive is likely to be brittle, while if it exceeds 1,000,000, solubility of the resin lowers and preparation of an adhesive becomes difficult. If it is less than 10,000, an adhesive has tackiness so that there is a fear of worsening workability at the time of peeling the adhesive from a peelable substrate board. If it exceeds 450,000, fluidity of the adhesive is lowered and when connection between a connecting terminal of an electronic member and a connecting terminal of a circuit substrate is carried out, there is a fear of difficultly filling the adhesive between the electronic parts and the circuit substrate.

The polyhydroxy polyether resin represented by the formula (II) is preferably an alternating copolymer of the biphenol derivative and the fluorenylidene diphenol derivative. If it is a block copolymer, it is difficult to obtain a stable solubility, and a homopolymer of the fluorenylidene diphenol derivative is inferior in solubility while Tg is elevated. On the other hand, a biphenol polymer cannot give a high Tg polymer while water absorption ratio is lowered.

As the aromatic hydrocarbon solvent, there may be mentioned, for example, benzene, toluene, xylene and ethyl benzene. As the other organic solvent to be used by mixing with the aromatic hydrocarbon solvent, an oxygen-containing organic solvent containing an oxygen atom in the molecule is preferred. As the oxygen-containing organic solvent, there may be mentioned, for example, an ester type solvent such as ethyl acetate; a ketone type solvent such as acetone, methyl ethyl ketone, cyclohexanone, etc.; an ether type solvent such as tetrahydrofuran, dioxane, etc.; a solvent such as dimethyl sulfoxide, etc.; and an amide type solvent such as dimethylformamide, N-methylpyrrolidone, N,N-dimethylacetamide, etc.

As (B) the three dimensionally cross-linkable resin to be used in the resin composition and the adhesive for the circuit substrate of the present invention, there may be mentioned an epoxy resin, a cyanate ester resin, an imide type resin, an acrylate, methacrylate or maleimide compound which are radical polymerizable substance, etc., and they are used in combination with a curing agent.

In the case of the epoxy resin, as a curing agent, a conventionally known imidazole type, hydrazide type, trifluoroborate-amine complex, sulfonium salt, amine imide, salt of polyamine, dicyane diamide, etc. may be used singly or in admixture of two or more. As the epoxy resin, a bisphenol type epoxy resin derived from bisphenol A, F, S, AD, etc.; an epoxy novolak type resin derived from phenol novolak, cresol novolak, etc.; a naphthalene type epoxy resin having a naphthalene skeleton; a glycidyl amine type epoxy resin; a glycidyl ether type epoxy resin; various kinds of epoxy resin having two or more glycidyl ether groups in the molecule such as biphenyl, alicyclic, etc., and other conventionally known epoxy resin singly or in admixture of two or more. As such an epoxy resin, a high purity product in which impurity ions such as an alkali metal ion, an alkaline earth metal ion, a halogen ion, particularly a chlorine ion or hydrolyzable chlorine, etc. is reduced to 300 ppm or less, is preferably used for the purpose of preventing from electromigration or corrosion of a circuit metal conductive material.

As the cyanate ester resin, there may be mentioned, for example, bis(4-cyanatophenyl)ethane, 2,2-bis(4- cyanatophenyl)propane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, a cyanate ester compound of a phenol added dicyclopentadiene polymer, etc., and a prepolymer thereof is used singly or in admixture of two or more. Of these, 2,2-bis(4-cyanatophenyl)propane, 2,2-bis(3,5-dimethyl-4-cyanatophenyl)methane, etc. are preferred since dielectric characteristics of the cured product are particularly excellent. As the curing agent for the cyanate ester resin, a metal type reaction catalyst is used. More specifically, there may be mentioned an organic metal salt compound such as a 2-ethylhexanoate, a naphthenate, etc., and an organic metal complex such as an acetylacetone complex, etc.

An amount of the metal type reaction catalyst is preferably 1 to 3000 ppm, more preferably 1 to 1000 ppm, further preferably 2 to 300 ppm based on the amount of the cyanate ester compound. If the amount of the metal type reaction catalyst is less than 1 ppm, reactivity and curabilitytend to be insufficient, while if it exceeds 3000 ppm, control of the reaction becomes difficult or a curing takes place too fast, but the amount is not specifically limited.

The acrylate, methacrylate and maleimide compound which are radical polymerizable substance are substances having a functional group polymerizable by a radical. The radical polymerizable substance can be used in either of the state of a monomer or an oligomer, and a monomer and an oligomer may be used in combination.

Specific examples of the acrylate (including a methacrylate corresponding to the following acrylate, hereinafter the same) may include, for example, methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(acryloxymethoxy)phenyl]propane, dicyclopentenyl acrylate, tricyclodecanyl acrylate, tris(acryloyloxyethyl)isocyanurate, etc. These acrylates may be used singly or in admixture of two or more, and a polymerization inhibitor such as hydroquinone, methyl ether hydroquinone, etc., may be optionally used, if necessary. Also, when it has a dicyclopentenyl group and/or a tricyclodecanyl group and/or a triazine ring, it is more preferred since heat resistance can be improved.

As the maleimide compound, those having two or more maleimide group in the molecule may be mentioned. As such a maleimide compound, there may be mentioned, for example, 1-methyl-2,4-bismaleimidobenzene, N,N'-m-phenylenebismaleimide, N,N'-p-phenylenebismaleimide, N,N'-m-tolylenebismaleimide, N,N'-4,4'-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenylsulfonebismaleimide, 2,2-bis(4-(4-maleimidophenoxy)phenyl)propane, 2,2-bis(3-s-butyl-4,8-(4-maleimidophenoxy)phenyl)propane, 1,1-bis(4-(4-maleimidophenoxy)phenyl)decane, 4,4'-cyclohexylidene-bis(1-(4-maleimidophenoxy)-2-cyclohexylbenzne, 2,2-bis(4-(4-maleimidophenoxy)phenyl) hexafluoropropane, etc. These may be used singly or in admixture of two or more.

As a curing agent for the radical polymerizable substance such as the acrylate, methacrylate and maleimide compound, etc., a curing agent which generates a free radical by heating or photoirradiation may be used. More specifically, it is preferably selected from an organic peroxide such as a peroxy ester, dialkyl peroxide, hydroperoxide, diacyl peroxide, peroxydicarbonate, peroxyketal, silyl peroxide, etc., more preferably, it is selected from a peroxy ester giving high reactivity. The above-mentioned curing agent may be optionally used in admixture of two or more.

As the peroxy ester, there may be mentioned, for example, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxypivalate, 1,1,3,3-tetramethylbutyl peroxy-2-ethylhexanonate, 2,5-dimethyl-2,5-di(2-ethylhexanoyl peroxy)hexane, 1-cyclohexyl-1-methylethyl peroxy-2-ethylhexanonate, t-hexyl peroxy-2-ethylhexanonate, t-butyl peroxy-2-ethylhexanonate, t-butyl peroxyisobutyrate, 1,1-bis(t-butyl peroxy)cyclohexane, t-hexyl peroxyisopropyl monocarbonate, t-butyl peroxy-3,5,5-trimethylhexanonate, t-butyl peroxylaurate, 2,5-dimethyl-2,5-di(m-toluoyl peroxy)hexane, t-butyl peroxyisopropyl monocarbonate, t-butyl peroxy-2-ethylhexyl monocarbonate, t-butyl peroxybenzoate, t-butyl peroxyacetate, etc.

As the dialkyl peroxide, there may be mentioned, for example, a,a'-bis(t-butyl peroxy)diisopropylbenzene, dicumyl peroxide, 2,5-dimethyl-2,5-di(t-butyl peroxy)-hexane, t-butylcumyl peroxide, etc.

As the hydroperoxide, there may be mentioned, for example, diisopropylbenzene hydroperoxide, cumene hydroperoxide, etc.

As the diacyl peroxide, there may be mentioned, for example, isobutyl peroxide, 2,4-dichlorobenzoylperoxide, 3,5,5-trimethylhexanoyl peroxide, octanoyl peroxide, lauroyl peroxide, stearoyl peroxide, succinic peroxide, benzoyl peroxytoluene, benzoyl peroxide, etc.

As the peroxydicarbonate, there may be mentioned, for example, di-n-propyl peroxydicarbonate, diisopropyl peroxydicarbonate, bis(4-t-butylcyclohexyl) peroxydicarboante, di-2-ethoxymethoxy peroxydicarbonate, d-(2-ethylhexyl peroxy)dicarbonate, dimethoxybutyl peroxydicarbonate, di(3-methyl-3-methoxybutyl peroxy) dicarbonate, etc.

As the peroxy ketal, there may be mentioned, for example, 1,1-bis(t-hexyl peroxy)-3,3,5-trimethylcyclohexane, 1,1-bis(t-hexyl peroxy)cyclohexane, 1,1-bis(t-butyl peroxy)-3,3,5-trimethylcyclohexane, 1,1-(t-butyl peroxy)cyclododecane, 2,2-bis(t-butyl peroxy)decane, etc.

As the silyl peroxide, there may be mentioned, for example, t-butyltrimethylsilyl peroxide, bis(t-butyl)-dimethylsilyl peroxide, t-butyltrivinylsilyl peroxide, bis(t-butyl)divinylsilyl peroxide, tris(t-butyl)vinylsillyl peroxide, t-butyltriallylsilyl peroxide, bis(t-butyl)diallylsillyl peroxide, tris(t-butyl)allylsillyl peroxide, etc.

These curing agents which generate free radical can be used singly or in admixture of two or more, and a decomposition promoting agent, an inhibitor, etc., may be mixed.

Also, when the above-mentioned curing agents are coated with a high molecular weight substance such as a polyurethane type or a polyester type polymer, etc., to form a microcapsule, it is preferred since a usable time of such a material can be elongated.

In the resin composition or the adhesive to be used for a circuit board of the present invention, (A) the polyhydroxy polyether resin and (B) the three dimensionally cross-linkable resin are preferably formulated in amounts (weight ratio, (A):(B)) of 1:99 to 99:1, more preferably 10:90 to 90:10. If the amount of (A) the polyhydroxy polyether resin is less than 1 part by weight, low water absorption property, flexibility and stress absorbing property possessed by the resin cannot be shown, while if it exceeds 99 parts by weight, the resulting material tends to have lowered heat resistance.

To the resin composition or the adhesive to be used for a circuit board of the present invention, a rubber component such as an acrylic rubber for the purpose of lowering elasticity of the cured product may be added.

Also, to the resin composition or the adhesive to be used for a circuit board of the present invention, a thermoplastic resin such as a phenoxy resin, etc., may be added to make film formability easy. When an epoxy type resin is used as a base resin, the phenoxy resin is particularly similar in structure to the epoxy resin and has characteristics excellent in compatibility with the epoxy resin, excellent in adhesive property, etc. so that it is preferred.

For forming a film from the resin composition or the adhesive to be used for a circuit board, it is carried out by dissolving or dispersing the resin composition or the adhesive containing the three dimensionally cross-linkable resin, its curing agent and the polyhydroxy polyether resin in an organic solvent to prepare a varnish, coating the same on a peelable supporting material and removing the solvent at a temperature lower than the active temperature of the curing agent. In particular, it is carried out by dissolving or dispersing the resin composition or the adhesive containing an epoxy resin as the three dimensionally cross-linkable resin, a latent type curing agent and the polyhydroxy polyether resin represented by the formula (I) and/or (II) in an organic solvent to prepare a liquid material, coating the same on a peelable supporting material and removing the solvent at a temperature lower than the active temperature of the curing agent.

As the solvent to be used at this time, the aromatic hydrocarbon type solvent and the oxygen atom containing organic solvent as mentioned above are preferred.

It is preferred that a coupling agent is formulated to the resin composition or the adhesive of the present invention, and as the coupling agent, a material having a vinyl group, an acryl group, a methacryl group, an amino group, an epoxy group or an isocyanate group is preferred in the point of improving adhesiveness.

To the resin composition or the adhesive to be used for a circuit board, a conductive particle may be added for absorbing height fluctuation of a bump of the chip or a substrate electrode, etc., to positively provide anisotropic conductivity.

As the conductive particle, there may be mentioned, for example metal particles such as Au, Ni, Ag, Cu or a solder, etc., or metal particles in which a thin film of gold or palladium, etc., is formed on the above metal particles by plating or deposition, etc. Also, conductive particles in which a conductive layer of Ni, Cu, Au or a solder, etc., is formed on a spherical polymer core material such as a polystyrene, etc. may be used. The particle size is required to be less than the minimum distance of the electrodes of the substrate, and when there is fluctuation in a height of the electrodes, it is preferred to have a larger size than the height of fluctuation. When an inorganic filler is to be formulated, it is preferred to use the particles having larger than the average particle size of the filler, more preferably 1 to 10 $\mu$m. Also, an amount of the conductive particles to be dispersed in the adhesive is preferably 0.1 to 30% by volume, more preferably 0.2 to 20% by volume.

The resin composition or the adhesive to be used for a circuit board of the present invention can be easily prepared by dissolving or dispersing the respective components in an organic solvent, and stirring and mixing by an optional method, and further by coating on a peelable supporting material and removing the solvent at a temperature lower than the active temperature of the curing agent to carry out formation of a film. At this time, in addition to the above-mentioned formulating compositions, any additive(s) to be used for preparing a usual epoxy resin composition may be added.

The thickness of the film state adhesive is not specifically limited, but it is preferably thicker than the gap between the first and the second circuit members, and generally desirable that it is thicker than the gap 5 $\mu$m or more.

EXAMPLES

In the following, the present invention is specifically explained by referring to Examples.

Example 1

In 1000 ml of N-methylpyrrolidone were dissolved 45 g of 1,1-(4,4'-dihydroxydiphenyl)undecane and 53 g of 3,3', 5,5'-tetramethylbiphenol diglycidyl ether (epoxy equivalent: 194), and 23 g of potassium carbonate was added to the mixture and the resulting mixture was stirred at 110° C. After stirring for 3 hours, the resulting mixture was added dropwise to a large amount of methanol, and a formed precipitate was obtained by filtration to give 78 g of the resin (A) having a structure represented by the formula (I) as an objective material. When a molecular weight of the resulting product was measured by gel permeation chromatography (GPC 8020, trade name, manufactured by TOSO K. K., Japan) with columns of TSK gel G3000HXL and TSK gel G4000HXL both trade names, manufactured by TOSO K. K., Japan with a flow rate of 1.0 ml/min, it was Mn=11112, Mw=17272 and Mw/Mn=1.55 in terms of polystyrene standard.

The resin (A) having the structure represented by the formula (I) was dissolved in THF (tetrahydrofuran), and the solution was coated to Petri dish and the solvent was evaporated to form a cast film. The cast film was cut into 2 cm square, dried under reduced pressure at 100° C., weighed and after dipping in pure water for 24 hours, weighed again to calculate increase in weight so that a water absorption rate of the thermoplastic resin represented by the formula (I) was measured. As a result of the water absorption ratio, the formed resin had a water absorption ratio of 0.7%. Also, a modulus of elasticity of the cast film was measured by using a dynamic viscoelasticity measurement device Solid Analyzer RSA-II (trade name) manufactured by Rheometric Scientific Co. (a temperature raising rate: 5° C./min, 1 Hz), and Tg was measured by the peak value of tan δ so that it was 72° C.

In 30 g of a mixed solvent of toluene:ethyl acetate=1:1 in a weight ratio was dissolved 20 g of the formed polyhydroxy polyether resin represented by the formula (I) to obtain a 40% by weight solution. Then, to the above solution was added a 50% by weight solution comprising 4.3 g of a trihydroxy ether type epoxy resin (epoxy equivalent: 195) dissolved in 8.6 g of a mixed solution of toluene: ethyl acetate=1:1 in a weight ratio, and then, to the resulting solution was added 28.6 g of a commercially available liquid epoxy resin (a bisphenol F type epoxy resin, an imidazole type curing agent is encapsulated by the bisphenol F type epoxy resin, epoxy equivalent: 185) containing a microcapsule type latent curing agent, and the mixture was stirred. Further, 3% by volume of conductive particles prepared by providing a nickel layer with a thickness of 0.2 μm on the surface of a polystyrene type core material (a diameter: 5 μm) and further forming an Au layer with a thickness of 0.04 μm on the outside surface of the nickel layer was dispersed in the above-mentioned solution to prepare a varnish solution for forming a film. This solution was coated onto a separator (a polyethylene terephthalate film treated by silicone, a thickness: 40 μm) as a peelable supporting material by using a roll coater, and dried at 70° C. for 10 minutes to prepare an adhesive film having a thickness of 30 μm. This adhesive film was cured at 180° C. for 20 seconds and further at 150° C. for one hour. A modulus of elasticity of the resulting cured film was measured by using a dynamic viscoelasticity measurement device (a temperature raising rate: 5° C./min, 1 Hz), and Tg was measured by the peak value of tan δ, which was 144° C.

Next, by using the thus prepared adhesive film, connection between a gold bump (surface area: 80×80 μm, space: 30 μm, a height: 15 μm, a number of bumps: 288)-attached chip (10×10 mm, a thickness: 0.5 mm) and a Ni/Au plated Cu circuit printed board (a height of electrode: 20 μm, a thickness: 0.8 mm) was carried out as mentioned below. The adhesive film (12×12 mm) was tentatively connected to the Ni/Au plated Cu circuit printed board at 60° C. and 0.5 MPa for 3 seconds, and then, the separator was peeled off. After subjecting to positioning of the bump of the chip and the Ni/Au plated Cu circuit printing board, heating and pressurizing were carried out from the upper direction of the chip under the conditions of 180° C., 100 g/bump for 20 seconds to carry out main connection to obtain a circuit board.

Connection resistance after main connection was 5 mΩ at the maximum value per bump, 1.5 mΩ with an average value and an insulation resistance was $10^8$ Ω or higher.

A number of these circuit boards were prepared in the same manner as mentioned above and a thermal shock test from −55 to 125° C. was carried out for 1000 cycles. Also, 200 hours of a PCT test (at 121° C., 2 atm) and 10 seconds dipping in a solder bath at 260° C. were carried out and a connection resistance was measured in the same manner as mentioned above. As a result, there was no change in the values of 5 mΩ at the maximum value per bump and an insulation resistance of $10^8$ Ω or higher, so that good connection reliability was shown.

Example 2

The adhesive film attached with a separator obtained in Example 1 was preserved at room temperature for one month, and then, a chip and a substrate were connected in the same manner as in Example 1 to obtain a circuit board. A connection resistance of the circuit board after connection was 7.5 mΩ at the maximum value per bump, 1.7 mΩ with an average value and an insulation resistance was $10^8$ Ω or higher.

A number of these circuit boards were prepared in the same manner as mentioned above and a thermal shock test from −55 to 125° C. was carried out for 1000 cycles in the same manner as in Example 1. Also, 200 hours of a PCT test (at 121° C., 2 atm) and 10 seconds of dipping in a solder bath at 260° C. were carried out and a connection resistance was measured in the same manner as mentioned above. As a result, there was no change in the values of 8 mΩ at the maximum value per bump, 1.9 mΩ with an average value and an insulation resistance of $10^8$ Ω or higher, so that good connection reliability was shown.

Example 3

In 30 g of a mixed solvent of toluene:ethyl acetate=1:1 in a weight ratio was dissolved 20 g of the polyhydroxy polyether resin represented by the formula (I) prepared in Example 1 whereby a 40% by weight solution was obtained. Then, to the above solution were added 20 g of ethylene glycol dimethacrylate and 2 g of benzoyl peroxide, and the mixture was stirred. Further, 3% by volume of conductive particles prepared by providing a nickel layer with a thickness of 0.2 μm on the surface of a polystyrene type core material (a diameter: 5 μm) and further forming an Au layer with a thickness of 0.04 μm on the outside surface of the nickel layer was dispersed in the above-mentioned solution to prepare a varnish solution for forming a film. This solution was coated onto a separator (a polyethylene terephthalate film treated by silicone, a thickness: 40 μm) as a peelable supporting material by using a roll coater, and dried at 70° C. for 10 minutes to prepare an adhesive film having a thickness of 30 μm. This adhesive film was cured at 180° C. for 20 seconds and further at 150° C. for one hour. A modulus of elasticity of the resulting cured film was measured by using a dynamic viscoelasticity measurement device Solid Analyzer RSA-II (trade name) manufactured by Rheometric Scientific Co. (a temperature raising rate: 5° C./min, 1 Hz), and Tg was measured by the peak value of tan δ, which was 96° C.

Next, by using the thus prepared adhesive film, connection between a gold bump (surface area: 80×80 μm, space: 30 μm, a height: 15 μm, a number of bumps: 288)-attached chip (10×10 mm, a thickness: 0.5 mm) and a Ni/Au plated Cu circuit printed board (a height of electrode: 20 μm, a thickness: 0.8 mm) was carried out as mentioned below. The adhesive film (12×12 mm) was tentatively connected to the Ni/Au plated Cu circuit printed board at 60° C. and 0.5 MPa for 3 seconds. After tentative connection, the separator was peeled off. After subjecting to positioning of the bump of the chip and the Ni/Au plated Cu circuit printing board, heating and pressurizing were carried out from the upper direction of the chip under the conditions of 180° C., 100 g/bump for 20 seconds to carry out main connection to obtain a circuit board.

Connection resistance after main connection was 5 mΩ at the maximum value per bump, 1.5 mΩ with an average value and an insulation resistance was $10^8$ Ω or higher.

A number of these circuit boards were prepared in the same manner as mentioned above and a thermal shock test from −55 to 125° C. was carried out for 1000 cycles. Also, 200 hours of a PCT test (at 121° C., 2 atm) and 10 seconds of dipping in a solder bath at 260° C. were carried out and a connection resistance was measured in the same manner as mentioned above. As a result, there was no change in the values of 5 mΩ at the maximum value per bump and an insulation resistance of $10^8$ Ω or higher, so that good connection reliability was shown.

Example 4

In 30 g of methyl ethyl ketone (MEK) was dissolved 20 g of the polyhydroxy polyether resin represented by the formula (I) prepared in Example 1 whereby a 40% by weight solution was obtained. Then, to the above solution were added 10 g of dicyclopentenyl acrylate, 3 g of methacryloxypropyl trimethoxysilane and 1 g of 1,1-bis(t-hexylperoxy)-3,3,5-trimethylcyclohexane, and the mixture was stirred. Further, 3% by volume of conductive particles prepared by providing a nickel layer with a thickness of 0.2 µm on the surface of a polystyrene type core material (a diameter: 4 µm) and further forming an Au layer with a thickness of 0.04 µm on the outside surface of the nickel layer was dispersed in the above-mentioned solution to prepare a varnish solution for forming a film. This solution was coated onto a separator (a polyethylene terephthalate film treated by silicone, a thickness: 40 µm) as a peelable supporting material by using a roll coater, and dried at 70° C. for 10 minutes to prepare an adhesive film having a thickness of 30 µm. This adhesive film was cured at 180° C. for 20 seconds and further at 150° C. for one hour. A modulus of elasticity of the resulting cured film was measured by using a dynamic viscoelasticity measurement device Solid Analyzer RSA-II (trade name) manufactured by Rheometric Scientific Co. (a temperature raising rate: 5° C./min, 1 Hz), and Tg was measured by the peak value of tan δ, which was 120° C.

Next, by using the thus prepared adhesive film, tentative connection between gold bumps (surface area: 50×50 µm and 50×90 µm, a number of bumps: 178 and 184, respectively—attached chip (1.7×17.2 mm, a thickness: 0.55 mm) and an ITO circuit glass substrate was carried out at 60° C. and 0.5 MPa for 3 seconds. After tentative connection, the separator was peeled off. After subjecting to positioning of the bumps of the chip and the ITO circuit glass substrate, heating and pressurizing were carried out from the upper direction of the chip under the conditions of 200° C., 100 MPa/bump for 3 seconds to carry out main connection to obtain a circuit board.

Connection resistance after main connection was 100 mΩ at the maximum value per bump, 25 mΩ with an average value and an insulation resistance was $10^8$ Ω or higher.

A number of these circuit boards were prepared in the same manner as mentioned above and a thermal shock test from −40 to 100° C. was carried out for 1000 cycles. Also, a high temperature and high humidity test at 85° C./85% RH (relative humidity) was carried out for 1000 hours and a connection resistance was measured in the same manner as mentioned above. As a result, the connection resistance was 3.4 Ω at the maximum value per bump, 1.4 Ω with an average value and there was no change in the value of an insulation resistance of $10^8$ Ω or higher, so that good connection reliability was shown.

Example 5

In 1000 ml of N-methylpyrrolidone were dissolved 45 g of 4,4'-(9-fluorenylidene)-diphenol and 50 g of 3,3',5,5'-tetramethylbiphenol diglycidyl ether, and then, 21 g of potassium carbonate was added to the solution and the mixture was stirred at 110° C. After stirring for 3 hours, the resulting mixture was added dropwise to a large amount of methanol, and a formed precipitate was obtained by filtration to give 75 g of the resin (A) having a structure represented by the formula (II) as an objective material. When a molecular weight of the resulting product was measured by gel permeation chromatography (GPC 8020, trade name, manufactured by TOSO K. K., Japan) with columns of TSK gel G3000HXL and TSK gel G4000HXL both trade names, manufactured by TOSO K. K., Japan with a flow rate of 1.0 ml/min, it was Mn=33471, Mw=143497 and Mw/Mn=4.29 in terms of polystyrene standard.

The polyhydroxy polyether resin (A) having the structure represented by the formula (II) was dissolved in THF, and the solution was coated to Petri dish and the solvent was evaporated to form a cast film. A modulus of elasticity of the cast film was measured by using a dynamic viscoelasticity measurement device Solid Analyzer RSA-II (trade name) manufactured by Rheometric Scientific Co. (a temperature raising rate: 5° C./min, 1 Hz), and Tg was measured by the peak value of tan δ, so that a peak was observed at 95° C.

In 30 g of a mixed solvent of toluene:ethyl acetate=1:1 in a weight ratio was dissolved 10 g of the formed polyhydroxy polyether resin represented by the formula (II) to obtain a 25% by weight solution. Then, to the above solution was added a 50% by weight solution comprising 4.3 g of a trihydroxy ether type epoxy resin (epoxy equivalent: 195) dissolved in 8.6 g of a mixed solution of toluene: ethyl acetate=1:1 (a weight ratio), and then, to the resulting solution was added 14.3 g of a liquid epoxy resin (a bisphenol F type epoxy resin, an imidazole type curing agent is encapsulated by the bisphenol F type epoxy resin, epoxy equivalent: 185) containing a commercially available microcapsule type latent curing agent, and the mixture was stirred. Further, 3% by volume of conductive particles prepared by providing a nickel layer with a thickness of 0.2 µm on the surface of a polystyrene type core material (a diameter: 5 µm) and further forming an Au layer with a thickness of 0.04 µm on the outside surface of the nickel layer was dispersed in the above-mentioned solution to prepare a varnish solution for forming a film. This solution was coated onto a separator (a polyethylene terephthalate film treated by silicone, a thickness: 40 µm) as a peelable supporting material by using a roll coater, and dried at 100° C. for 10 minutes to prepare an adhesive film having a thickness of 40 µm. This adhesive film was cured at 150° C. for 3 hours. A modulus of elasticity of the resulting cured film was measured by using a dynamic viscoelasticity measurement device (a temperature raising rate: 5° C./min, 1 Hz), and Tg was measured by the peak value of tan δ, which was 182° C. Also, a preserved modulus of elasticity at 40° C. was 2.1 GPa.

Next, by using the thus prepared adhesive film, connection between a gold bump (surface area: 80×80 µm, space: 30 µm, a height: 15 µm, a number of bumps: 288)-attached chip (10×10 mm, a thickness: 0.5 mm) and a Ni/Au plated Cu circuit printed board (a height of electrode: 20 µm, a thickness: 0.8 mm) was carried out as mentioned below. The adhesive film (12×12 mm) was tentatively connected to the Ni/Au plated Cu circuit printed board at 60° C. and 0.5 MPa for 3 seconds, and then, the separator was peeled off after tentative connection. After subjecting to positioning of the bump of the chip and the Ni/Au plated Cu circuit printing board, heating and pressurizing were carried out from the upper direction of the chip under the conditions of 170° C., 30 g/bump for 20 seconds to carry out main connection to obtain a circuit board.

Connection resistance after main connection was 5 mΩ at the maximum value per bump, 1.5 mΩ with an average value and an insulation resistance was $10^8$ Ω or higher.

A number of these circuit boards were prepared in the same manner as mentioned above and a thermal shock test from −55 to 125° C. was carried out for 1000 cycles. Also, 200 hours of a PCT test (at 121° C., 2 atm) and 10 seconds dipping in a solder bath at 260° C. were carried out and a connection resistance was measured in the same manner as mentioned above. As a result, there was no change in the values of 5 mΩ at the maximum value per bump and an insulation resistance of $10^8$ Ω or higher, so that good connection reliability was shown.

Example 6

In 30 g of a mixed solvent of toluene:ethyl acetate=1:1 (weight ratio) was dissolved 20 g of the polyhydroxy polyether resin represented by the formula (II) prepared in Example 5 whereby a 40% by weight solution was obtained. Then, to the above solution were added 20 g of ethylene glycol dimethacrylate and 2 g of benzoyl peroxide, and the mixture was stirred. Further, 3% by volume of conductive particles prepared by providing a nickel layer with a thickness of 0.2 μm on the surface of a polystyrene type core material (a diameter: 5 μm) and further forming an Au layer with a thickness of 0.04 μm on the outside surface of the nickel layer was dispersed in the above-mentioned solution to prepare a varnish solution for forming a film. This solution was coated onto a separator (a polyethylene terephthalate film treated by silicone, a thickness: 40 μm) as a peelable supporting material by using a roll coater, and dried at 70° C. for 10 minutes to prepare an adhesive film having a thickness of 30 μm. This adhesive film was cured at 180° C. for 20 seconds and further at 150° C. for one hour. A modulus of elasticity of the resulting cured film was measured by using a dynamic viscoelasticity measurement device Solid Analyzer RSA-II (trade name) manufactured by Rheometric Scientific Co. (a temperature raising rate: 50° C./min, 1 Hz), and Tg was measured by the peak value of tan δ, which was 96° C.

Next, by using the thus prepared adhesive film, connection between a gold bump (surface area: 80×80 μm, space: 30 μm, a height: 15 μm, a number of bumps: 288)-attached chip (10×10 mm, a thickness: 0.5 mm) and a Ni/Au plated Cu circuit printed board (a height of electrode: 20 pm, a thickness: 0.8 mm) was carried out as mentioned below. The adhesive film (12×12 mm) was tentatively connected to the Ni/Au plated Cu circuit printed board at 60° C. and 0.5 MPa for 3 seconds. After tentative connection, the separator was peeled off. After subjecting to positioning of the bump of the chip and the Ni/Au plated Cu circuit printing board, heating and pressurizing were carried out from the upper direction of the chip under the conditions of 180° C., 100 g/bump for 20 seconds to carry out main connection to obtain a circuit board.

Connection resistance after main connection was 5 mΩ at the maximum value per bump, 1.5 mΩ with an average value and an insulation resistance was $10^8$ Ω or higher.

A number of these circuit boards were prepared in the same manner as mentioned above and a thermal shock test from −55 to 125° C. was carried out for 1000 cycles. Also, 200 hours of a PCT test (at 121° C., 2 atm) and 10 seconds of dipping in a solder bath at 260° C. were carried out and a connection resistance was measured in the same manner as mentioned above. As a result, there was no change in the values of 5 mΩ at the maximum value per bump and an insulation resistance of $10^8$ Ω or higher, so that good connection reliability was shown.

Example 7

In 30 g of MEK was dissolved 20 g of the polyhydroxy polyether resin represented by the formula (II) prepared in Example 5 whereby a 40% by weight solution was obtained. Then, to the above solution were added 10 g of dicyclopentenyl acrylate, 3 g of methacryloxypropyl trimethoxysilane and 1 g of 1,1-bis(t-hexylperoxy)-3,3,5-trimethylcyclohexane, and the mixture was stirred. Further, 3% by volume of conductive particles prepared by providing a nickel layer with a thickness of 0.2 μm on the surface of a polystyrene type core material (a diameter: 4 μm) and further forming an Au layer with a thickness of 0.04 μm on the outside surface of the nickel layer was dispersed in the above-mentioned solution to prepare a varnish solution for forming a film. This solution was coated onto a separator (a polyethylene terephthalate film treated by silicone, a thickness: 40 μm) as a peelable supporting material by using a roll coater, and dried at 70° C. for 10 minutes to prepare an adhesive film having a thickness of 30 μm. This adhesive film was cured at 180° C. for 20 seconds and further at 150° C. for one hour. A modulus of elasticity of the resulting cured film was measured by using a dynamic viscoelasticity measurement device Solid Analyzer RSA-II (trade name) manufactured by Rheometric Scientific Co. (a temperature raising rate: 5° C./min, 1 Hz), and Tg was measured by the peak value of tan δ, which was 150° C.

Next, by using the thus prepared adhesive film, tentative connection between gold bumps (surface area: 50×50 μm and 50×90 μm, a number of bumps: 178 and 184, respectively—attached chip (1.7×17.2 mm, a thickness: 0.55 mm) and an ITO circuit glass substrate was carried out at 60° C. and 0.5 MPa for 3 seconds. After tentative connection, the separator was peeled off. After subjecting to positioning of the bumps of the chip and the ITO circuit glass substrate, heating and pressurizing were carried out from the upper direction of the chip under the conditions of 200° C., 100 MPa/bump for 3 seconds to carry out main connection to obtain a circuit board.

Connection resistance after main connection was 100 mΩ at the maximum value per bump, 25 mΩ with an average value and an insulation resistance was $10^8$ Ω or higher.

A number of these circuit boards were prepared in the same manner as mentioned above and a thermal shock test from −40 to 100° C. was carried out for 1000 cycles. Also, a high temperature and high humidity test at 85° C./85% RH (relative humidity) was carried out for 1000 hours and a connection resistance was measured in the same manner as mentioned above. As a result, the connection resistance was 3.4 Ω at the maximum value per bump, 1.4 Ω with an average value and there was no change in the value of an insulation resistance of $10^8$ Ω or higher, so that good connection reliability was shown.

Comparative Example 1

In 30 g of a mixed solvent comprising toluene:ethyl acetate=1:1 in a weight ratio was dissolved 20 g of a phenoxy resin (Mn=20000, Mw=45000) to obtain a 40% by weight solution. Then, to the solution was added 28.6 g of a liquid epoxy resin (a bisphenol F type epoxy resin, an imidazole type curing agent is encapsulated with the bisphenol F type epoxy resin, epoxy equivalent: 185) containing a commercially available microcapsule type latent curing agent, and the mixture was stirred. Further, 3% by volume of conductive particles prepared by providing a nickel layer with a thickness of 0.2 μm on the surface of a polystyrene type core material (a diameter: 5 μm) and further forming an Au layer with a thickness of 0.04 μm on the outside surface of the nickel layer was dispersed in the above-mentioned solution to prepare a varnish solution for forming a film. This solution was coated onto a separator (a polyethylene terephthalate film treated by silicone, a thickness: 40 μm) as a peelable supporting material by using a roll coater, and dried at 70° C. for 10 minutes to prepare an adhesive film having a thickness of 30 μm.

Next, by using the thus prepared adhesive film, connection between a gold bump (surface area: 80×80 μm, space: 30 μm, a height: 15 μm, a number of bumps: 288)-attached chip (10×10 mm, a thickness: 0.5 mm) and a Ni/Au plated Cu circuit printed board (a height of electrode: 20 μm, a thickness: 0.8 mm) was carried out as mentioned below. The adhesive film (12×12 mm) was tentatively connected to the Ni/Au plated Cu circuit printed board at 60° C. and 0.5 MPa for 3 seconds, and then, the separator was peeled off after tentative connection. After subjecting to positioning of the bump of the chip and the Ni/Au plated Cu circuit printing board, heating and pressurizing were carried out from the upper direction of the chip under the conditions of 180° C., 100 g/bump for 20 seconds to carry out main connection to obtain a circuit board.

Connection resistance after main connection was 5 mΩ at the maximum value per bump, 1.5 mΩ with an average value and an insulation resistance was $10^8$ Ω or higher.

When the circuit board was treated by the PCT test (at 121° C., 2 atm) in the same manner as mentioned above, peeling was generated between the chip and the adhesive after 144 hours and connection failure occurred.

As compared with Comparative example 1, the circuit boards using the polyhydroxy polyether resin represented by the formula (I) and/or (II) as the resin composition to be used in the present invention showed excellent results in water absorption property and heat resistance as shown in the PCT test.

INDUSTRIAL APPLICABILIYT

The resin composition or the circuit board of the present invention contains the polyhydroxy polyether resin represented by the formula (I) and/or (II) as an adhesive, and its water absorption ratio is 0.1 to 1.2% by weight and a glass transition temperature is 40 to 120° C. so that they are excellent in humidity resistance and relaxation of stress of the adhesive agent whereby connection reliability can be improved. Also, by using a three dimensionally cross-linkable resin in combination, a cured product excellent in heat resistance can be obtained, and when it is used as a circuit board, connection reliability can be markedly improved.

What is claimed is:

1. A resin composition which comprises (A) a polyhydroxy polyether resin represented by the following formula (I):

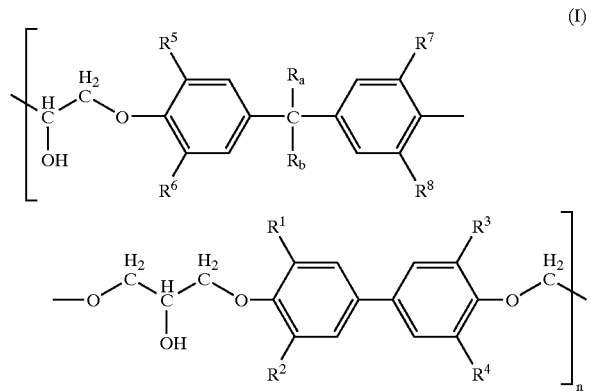

wherein $R^1$, $R^2$, $R^3$, $R^4$, $R^5$, $R^6$, $R^7$ and $R^8$ may be the same or different from each other and each represent a hydrogen atom, a straight or branched alkyl group having 1 to 4 carbon atoms, an alkenyl group having 2 to 5 carbon atoms, a hydroxyalkyl group having 1 to 4 carbon atoms or a halogen atom; $R_a$ represents a hydrogen atom or an alkyl group having 1 to 2 carbon atoms; $R_b$ represents a straight or branched alkyl group having 2 to 13 carbon atoms; and n is a number of a recurring unit and satisfying that a weight average molecular weight of the polyhydroxy polyether resin in terms of standard polystyrene is 5,000 to 1,000,000, and (B) a three dimensionally cross-linkable resin.

2. The resin composition according to claim 1, wherein a water absorption ratio of the polyhydroxy polyether resin represented by the formula (I) is 0.1 to 1.2% by weight and a glass transition temperature of the same is 40 to 100° C.

3. The resin composition according to claim 1, wherein a ratio of an amount of (A) the polyhydroxy polyether resin represented by the formula (I) and that of (B) the three dimensionally cross-linkable resin is (A)/(B)=1/99 to 99/1 in a weight ratio.

4. The resin composition according to claim 1, wherein (A) the polyhydroxy polyether resin represented by the formula (I) is dissolved in a mixed solvent of an aromatic hydrocarbon organic solvent and an oxygen-containing organic solvent.

5. The resin composition according to claim 1, wherein (B) the three dimensionally cross-linkable resin is an epoxy resin and a latent curing agent is contained.

6. The resin composition according to claim 1, wherein (B) the three dimensionally cross-linkable resin is a radical polymerizable substance and a curing agent which generates a free radical by irradiation of light or heating is contained.

7. The resin composition according to claim 1, wherein the composition is obtained by dissolving (A) the polyhydroxy polyether resin and (B) the three dimensionally cross-linkable resin in an aromatic hydrocarbon organic solvent and an oxygen-containing organic solvent, uniformly mixing a solution, coating the solution and drying and removing a coated material.

8. The resin composition according to claim 1, wherein the composition is obtained by curing the resin composition containing (A) the polyhydroxy polyether resin and (B) the three dimensionally cross-linkable resin by light or heat.

9. The resin composition according to claim 1, wherein the composition further comprises 0.1 to 20% by volume of conductive particles dispersed therein.

10. An adhesive for connecting a circuit member, which interposes between circuit electrodes opposed to each other, and, when these circuit electrodes opposed to each other are pressed, electrically connects these electrodes to a pressed direction, comprising (A) a polyhydroxy polyether resin represented by the following formula (I):

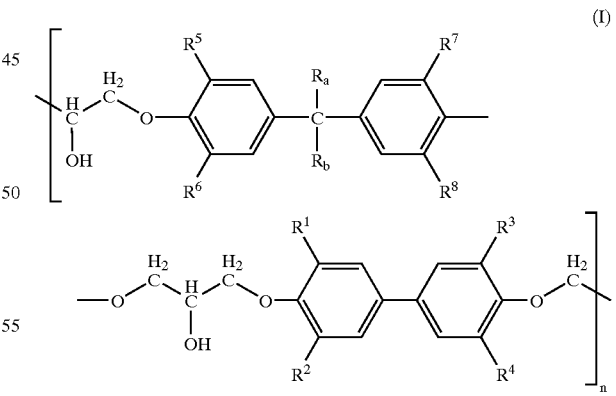

wherein $R^1$, $R^2$, $R^3$, $R^4$, $R^5$, $R^6$, $R^7$ and $R^8$ may be the same or different from each other and each represent a hydrogen atom, a straight or branched alkyl group having 1 to 4 carbon atoms, an alkenyl group having 2 to 5 carbon atoms, a hydroxyalkyl group having 1 to 4 carbon atoms or a halogen atom; $R_a$ represents a hydrogen atom or an alkyl group having 1 to 2 carbon atoms; $R_b$ represents a straight or branched alkyl group having 2 to 13 carbon atoms; and n is a number of a recurring unit and satisfying that a weight average molecular weight of the polyhydroxy polyether resin in terms of standard polystyrene is 5,000 to 1,000,000, and/or the following formula (II):

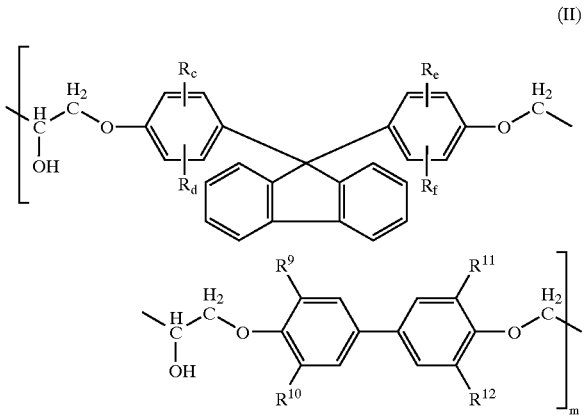

(II)

wherein $R^9$, $R^{10}$, $R^{11}$ and $R^{12}$ may be the same or different from each other and each represent a hydrogen atom, a straight or branched alkyl group having 1 to 6 carbon atoms, a hydroxyalkyl group having 1 to 6 carbon atoms or a halogen atom; $R_c$, $R_d$, $R_e$ and $R_f$ may be the same or different from each other and each represent a hydrogen atom, a straight or branched alkyl group having 1 to 6 carbon atoms, a cycloalkyl group having 6 carbon atoms, an aryl group, an aralkyl group or a halogen atom; and m is a number of a recurring unit and satisfying that a weight average molecular weight of the polyhydroxy polyether resin in terms of standard polystyrene is 5,000 to 1,000,000, and (B) a three dimensionally cross-linkable resin.

11. The adhesive for connecting a circuit member according to claim 10, wherein a water absorption ratio of the polyhydroxy polyether resin represented by the formula (I) is 0.1 to 1.2% by weight and a glass transition temperature of the same is 40 to 100° C.

12. The adhesive for connecting a circuit member according to claim 10, wherein a glass transition temperature of the polyhydroxy polyether resin represented by the formula (II) is 60 to 120° C.

13. The adhesive for connecting a circuit member according to claim 10 wherein (A) the polyhydroxy polyether resin represented by the formula (I) and/or (II) is dissolved in a mixed solvent of an aromatic hydrocarbon solvent and an oxygen-containing organic solvent.

14. The adhesive for connecting a circuit member according to claim 10, wherein (B) the three dimensionally cross-linkable resin is an epoxy resin and contains a latent curing agent.

15. The adhesive for connecting a circuit member according to claim 10, wherein the adhesive contains (A) the polyhydroxy polyether resin represented by the formula (I) and/or (II) capable of dissolving in a mixed solvent of an aromatic hydrocarbon solvent and an oxygen-containing organic solvent, and an epoxy resin and a latent curing agent, or, a radical polymerizable substance and a curing agent which generates a free radical by irradiation of light or heating.

16. The adhesive for connecting a circuit member according to claim 10, wherein the adhesive is in a film state.

17. The adhesive for connecting a circuit member according to claim 10, wherein the composition further comprises 0.1 to 20% by volume of conductive particles dispersed therein.

18. A circuit board which comprises a first circuit member having a first connecting terminal and a second circuit member having a second connecting terminal which are so provided to oppose to each other, and an adhesive interposed between the first connecting terminal and the second connecting terminal opposed to each other, and the first connecting terminal and the second connecting terminal opposed to each other being electrically connected by heating and pressurizing, wherein said adhesive contains (A) the polyhydroxy polyether resin represented by the following formula (I):

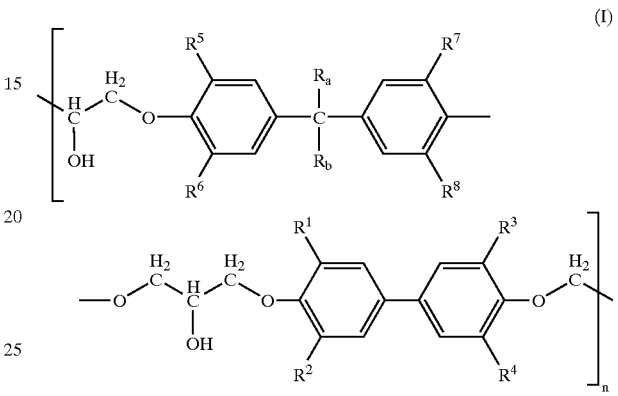

(I)

wherein $R^1$, $R^2$, $R^3$, $R^4$, $R^5$, $R^6$, $R^7$ and $R^8$ may be the same or different from each other and each represent a hydrogen atom, a straight or branched alkyl group having 1 to 4 carbon atoms, an alkenyl group having 2 to 5 carbon atoms, a hydroxyalkyl group having 1 to 4 carbon atoms or a halogen atom; $R_a$ represents a hydrogen atom or an alkyl group having 1 to 2 carbon atoms; $R_b$ represents a straight or branched alkyl group having 2 to 13 carbon atoms; and n is a number of a recurring unit and satisfying that a weight average molecular weight of the polyhydroxy polyether resin in terms of standard polystyrene is 5,000 to 1,000,000, and/or the following formula (II):

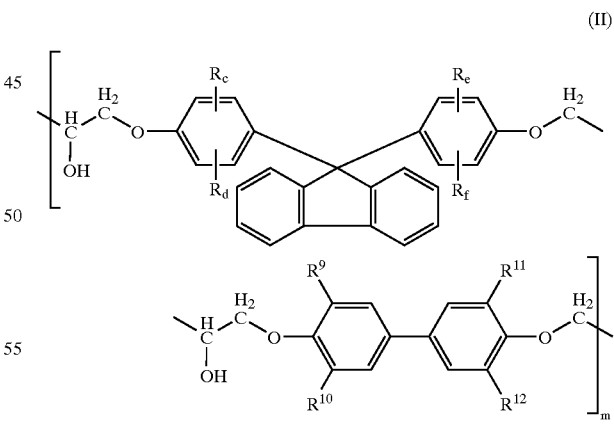

(II)

wherein $R^9$, R10, $R^{11}$ and $R^{12}$ may be the same or different from each other and each represent a hydrogen atom, a straight or branched alkyl group having 1 to 6 carbon atoms, a hydroxyalkyl group having 1 to 6 carbon atoms or a halogen atom; $R_c$, $R_d$, $R_e$ and $R_f$ may be the same or different from each other and each represent a hydrogen atom, a straight or branched alkyl group having 1 to 6 carbon atoms, a cycloalkyl group having 6 carbon atoms, an aryl group, an aralkyl group or a halogen atom; and m is a number of a recurring unit and satisfying that a weight average molecular weight of the polyhydroxy polyether resin in terms of standard polystyrene is 5,000 to 1,000,000,
and (B) a three dimensionally cross-linkable resin.

19. The circuit board according to claim 18, wherein (A) the polyhydroxy polyether resin represented by the formula (I) and/or (II) is dissolved in a mixed solvent of an aromatic hydrocarbon solvent and an oxygen-containing organic solvent.

20. The circuit board according to claim 18, wherein a water absorption ratio of the polyhydroxy polyether resin represented by the formula (I) is 0.1 to 1.2% by weight and a glass transition temperature of the same is 40 to 100° C.

21. The circuit board according to claim 18, wherein a glass transition temperature of the polyhydroxy polyether resin represented by the formula (II) is 60 to 120° C.

22. The circuit board according to claim 18, wherein (B) the three dimensionally cross-linkable resin is an epoxy resin and a latent curing agent is contained.

23. The circuit board according to claim 18, wherein the adhesive contains (A) the polyhydroxy polyether resin represented by the formula (I) and/or (II) capable of dissolving in a mixed solvent of an aromatic hydrocarbon organic solvent and an oxygen-containing organic solvent, and an epoxy resin and a latent curing agent, or a radical polymerizable substance and a curing agent which generates a free radical by irradiation of light or heating.

24. The circuit board according to claim 18, wherein the adhesive is in a film state.

25. The circuit board according claim 18, wherein the composition further comprises 0.2 to 20% by volume of conductive particles dispersed therein.

* * * * *